(12) United States Patent
Ishii

(10) Patent No.: US 8,139,330 B2
(45) Date of Patent: Mar. 20, 2012

(54) SEMICONDUCTOR INTEGRATED CIRCUIT

(75) Inventor: Hirotomo Ishii, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 611 days.

(21) Appl. No.: 12/275,320

(22) Filed: Nov. 21, 2008

(65) Prior Publication Data

US 2009/0135534 A1   May 28, 2009

(30) Foreign Application Priority Data

Nov. 22, 2007   (JP) ................................ 2007-303300

(51) Int. Cl.
*H02H 9/04* (2006.01)
*H02H 3/20* (2006.01)

(52) U.S. Cl. ........................................ 361/56; 361/91.1

(58) Field of Classification Search .................... 361/56, 361/91.1
See application file for complete search history.

(56) References Cited

U.S. PATENT DOCUMENTS

| 7,307,822 | B2 | 12/2007 | Kitagawa et al. | |
| 2004/0120087 | A1* | 6/2004 | Ishii | 361/56 |
| 2005/0135033 | A1* | 6/2005 | Kitagawa et al. | 361/91.1 |
| 2006/0262472 | A1 | 11/2006 | Okushima | |

OTHER PUBLICATIONS

Kitagawa et al, An Active ESP Protection Technique for the Power Domain Boundary in a Deep Submicron IC, EOS/ESD Symposium Proceedings, 2006, 4A.5-1-9.

* cited by examiner

*Primary Examiner* — Jared Fureman
*Assistant Examiner* — Angela Brooks
(74) *Attorney, Agent, or Firm* — Turocy & Watson, LLP

(57) ABSTRACT

A semiconductor integrated circuit includes a first and second power supply domain circuits having a first and second power supply terminals, respectively. An internal signal propagation line propagates a signal from a circuit of the first power supply domain circuit to that of the second power supply domain circuit. A voltage detector detects a surge voltage input to the first and second power supply terminals and outputs, from a control signal node, a control signal which is determined in accordance with a capacitive coupling by a first capacitor between the first power supply terminal and the control signal node, a second capacitor between the second power supply terminal and the control signal node, and a load capacitance at an output side of the control signal node. A voltage limiting circuit limits a voltage of a signal on the internal signal propagation line in accordance with the control signal.

20 Claims, 3 Drawing Sheets

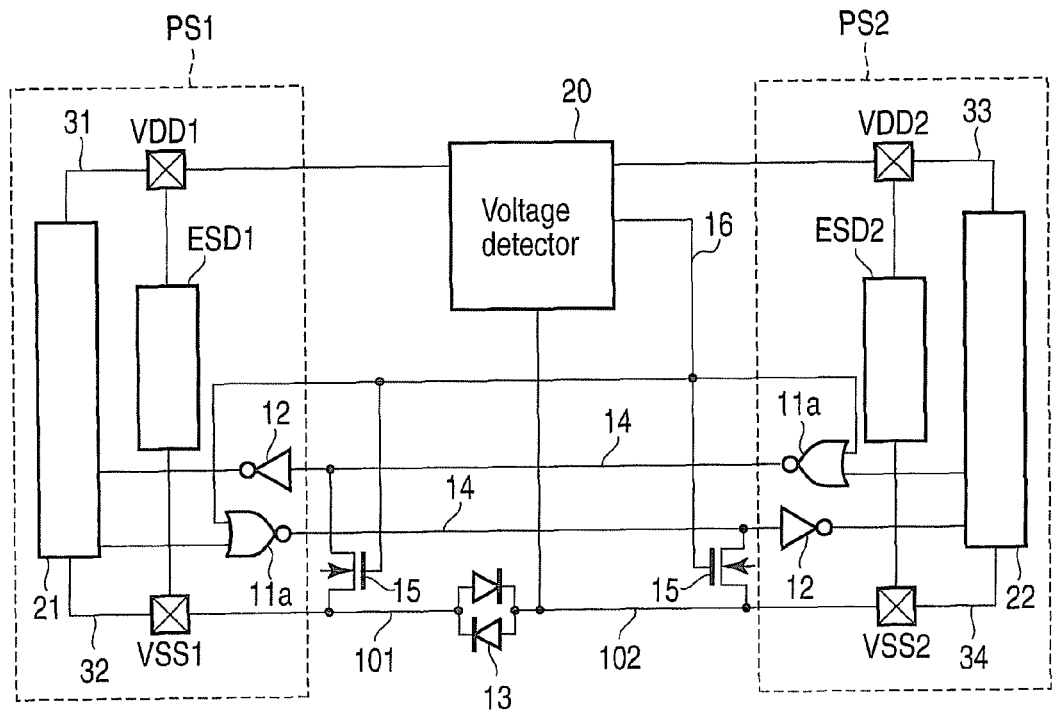
F I G. 4
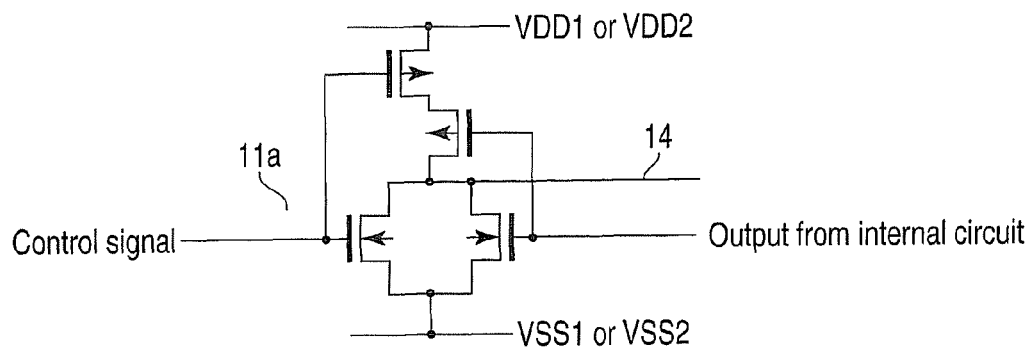
F I G. 5

SEMICONDUCTOR INTEGRATED CIRCUIT

CROSS-REFERENCE TO RELATED APPLICATIONS

This application is based upon and claims the benefit of priority from prior Japanese Patent Application No. 2007-303300, filed Nov. 22, 2007, the entire contents of which are incorporated herein by reference.

BACKGROUND OF THE INVENTION

1. Field of the Invention

The present invention relates to semiconductor integrated circuits, and more particularly to electrostatic discharge (ESD) protection circuits that protect a power supply boundary circuit from electrostatic discharge surge inputs applied to external terminals. It is applied to, for example, to low-power-supply-voltage complementary metal oxide semiconductor (CMOS) large-scale integrated circuits (LSIs).

2. Description of the Related Art

For example, in a CMOS LSI, an ESD protection circuit is connected between external terminals and an internal circuit in order to protect an input circuit and an output circuit from destruction due to ESD. Voltage clamp devices for ESD protection may be a diode, a transistor, or a silicon controlled rectifier (SCR).

Since the operational voltage of an SCR is generally high, when an ESD protection circuit using an SCR is applied to a miniaturized CMOS LSI with power supply of lowered voltage, it is desirable to achieve low-voltage trigger to protect MOS transistors with low gate-withstand voltage to improve their reliability.

It should be noted that a mixed-signal LSI generally contains analog circuitry vulnerable to noise signal interference, a low-voltage differential signaling (LVDS) circuit operable at high speed, and a dynamic semiconductor memory (embedded DRAM), etc. Power supply domains for such circuits are separated by the power-line separation technique and/or ground-line separation technique, and circuits belonging to different power supply domains exchange signals with each other. The techniques are effective because they reduce interference by noise signals among circuits and can set circuits in inactive power supply domains to a standby state, etc., and therefore are necessary.

In the conventional LSI with power supply domains separated by power-line separation technique and/or ground-line separation technique, when a surge current due to an ESD stress flows from a power supply terminal of one power supply domain to that of another power supply domain, the largest voltage is applied to power supply boundary devices (e.g., MOS devices) used for a circuit that carries a signal between different power supply domains. It is important to design an ESD protection circuit network to reduce the voltage below the withstand voltage of the MOS devices to prevent their gates from destruction. Since the current of an ampere order flows into the ESD protection circuit network when ESD stress is applied, it is important to consider not only ESD protection devices but parasitic resistance of interconnects in the network. On the other hand, withstand voltages of MOS transistors tend to fall with progress of the microfabrication technology of semiconductor integrated circuits, which makes the design of the ESD protection circuit network more difficult.

As a conventional art to prevent destruction of power supply boundary devices, the applicant of the present application proposed to use a detector circuit which consists of an inverter circuit, etc., to detect ESD applied to the power supply terminal (see U.S. Pat. No. 7,307,822). Since the threshold of the inverter circuit decides the detection threshold of ESD according to the technology, the detection threshold of ESD can be set by design, and it is easy to avoid malfunction by a power supply or ground bounce, etc. Moreover, the input circuit and output circuit which are used as power supply boundary circuits serve as simple inverter circuits in normal operation, and detection of ESD by the detector circuit generates an ESD detection signal which controls the connection among the input or output circuits to perform protection operation (ESD stress relief operation) for power supply boundary devices.

In the circuit of the U.S. Pat. No. 7,307,822 Publication, when an ESD stress is applied, a voltage of the same polarity as the normal power supply application is applied only to one of the two power supply domain circuits. Thus a detector circuit, an input circuit, and an output circuit only in the power supply domain function normally.

However, it is necessary to provide detector circuits in both of separated power supply domains in order to detect ESD stresses in both directions, therefore, the output signal line of each detector circuit must be independent to result in complicated signal traces.

Moreover, U.S. Pat. No. 7,352,547 discloses other conventional examples for preventing destruction of power supply boundary devices. The publication discloses that turning-on of a MOSFET in accordance with the potential difference between two points in the electric discharging path through which a surge current flows when ESD is applied to result in eased ESD stress on the power supply boundary devices. With this technology, the detection threshold voltage substantially equals to the threshold voltage of the MOSFET, and therefore it is difficult to freely set the detection threshold of ESD and to avoid malfunction by ground bounce, etc.

BRIEF SUMMARY OF THE INVENTION

According to a first aspect of the present invention, there is provided a semiconductor integrated circuit comprising: a first power supply domain circuit having a first power supply terminal and a first ground terminal; a second power supply domain circuit having a second power supply terminal and a second ground terminal; an internal signal propagation line propagating a signal from a circuit which belongs to the first power supply domain circuit to a circuit which belongs to the second power supply domain circuit; a voltage detector detecting a surge voltage input at the first power supply terminal and a surge voltage input at the second power supply terminal and outputting a control signal from a control signal node in accordance with the detection, the voltage detector determining a potential of the control signal node in accordance with a capacitive coupling by a first capacitor between the first power supply terminal and the control signal node, a second capacitor between the second power supply terminal and the control signal node, and a load capacitance at an output side of the control signal node; and a voltage limiting circuit connected to the internal signal propagation line, controlled by the control signal, and limiting a voltage of a signal on the internal signal propagation line.

According to a second aspect of the present invention, there is provided a semiconductor integrated circuit comprising: a first power supply domain circuit having a first power supply terminal and a first ground terminal; a second power supply domain circuit having a second power supply terminal and a second ground terminal; an internal signal propagation line propagating a signal from a circuit belonging to the first power supply domain circuit to a circuit belonging to the second power supply domain circuit; a voltage detector detecting a surge voltage input at the first power supply terminal and a surge voltage input at the second power supply terminal, and outputting a control signal from a control signal node in accordance with the detection; and a voltage limiting circuit connected to the internal signal propagation line, controlled by the control signal, and limiting a voltage of a signal on the internal signal propagation line.

According to a third aspect of the present invention, there is provided a semiconductor integrated circuit comprising: a first power supply domain circuit having a first power supply terminal, a first power line connected to the first power supply terminal, a first ground terminal and a first ground line connected to the first ground terminal; a second power supply domain circuit having a second power supply terminal, a second power line connected to the second power supply terminal, a second ground terminal, and a second ground line connected to the second ground terminal, wherein at least the first power line and the second power line are separated or the first ground line and the second ground line are separated; an internal signal propagation line propagating a signal from a circuit which belongs to the first power supply domain circuit to a circuit which belongs to the second power supply domain circuit; a voltage detector detecting a surge voltage input at the first power supply terminal and a surge voltage input at the second power supply terminal and outputting a control signal from a control signal node in accordance with the detection, the voltage detector determining a potential of the control signal node in accordance with a capacitive coupling by a first capacitor between the first power supply terminal and the control signal node, a second capacitor between the second power supply terminal and the control signal node, and a load capacitance at an output side of the control signal node; and a voltage limiting circuit connected to the internal signal propagation line, controlled by the control signal, and limiting a voltage of a signal on the internal signal propagation line.

BRIEF DESCRIPTION OF THE SEVERAL VIEWS OF THE DRAWING

FIG. 4 is a circuit diagram schematically showing a part of a CMOS LSI according to a third embodiment of the present invention.

FIG. 5 is a circuit diagram showing an example of the NOR gate in FIG. 4.

DETAILED DESCRIPTION OF THE INVENTION

Figure 1:
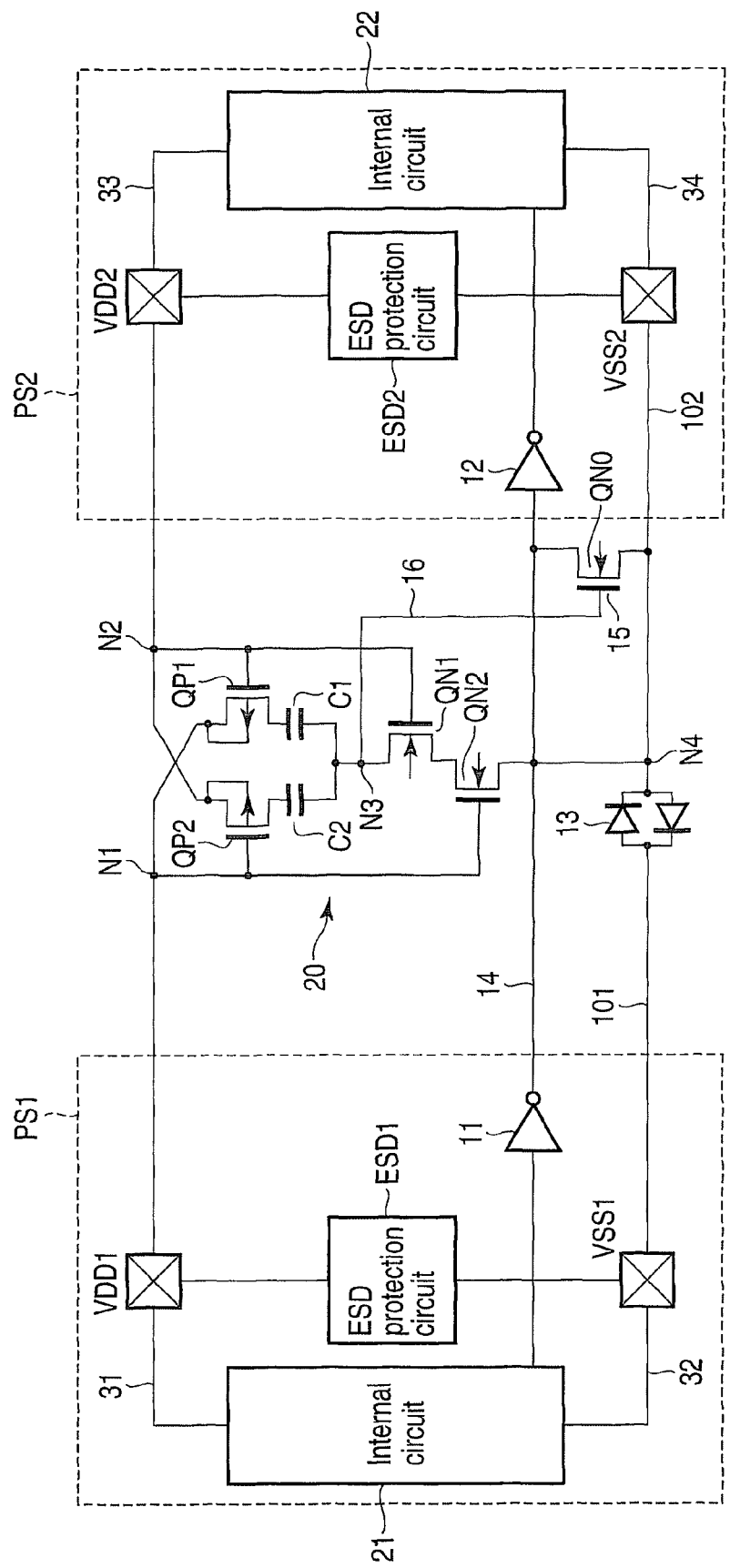
FIG. 1 is a circuit diagram schematically showing a part of a CMOS LSI according to a first embodiment of the present invention.

The present invention is applicable to an LSI which adopts more than one power supply domain, and has separated power supply terminals and/or separated ground terminals between the power supply domains. Here, separation refers to physical separation, and includes separated terminals with a metal interconnect between them.

Moreover, the present invention is applied to an LSI which adopts more than one power supply domain circuit and ground-line separation technique. In each following embodiment, pads on the LSI chip are connected to the external connection terminals (pins, bump electrodes, etc.) of a semiconductor device when the chip is incorporated into a package.

Hereafter, embodiments of the present invention is described with reference to drawings. Through the description, a common reference numeral is given to a feature which is common throughout drawings.

First Embodiment

FIG. 1 schematically shows a circuit of a part of a CMOS LSI according to the first embodiment of the present invention. Ground-line separation technique and more than one power supply domain are used for the CMOS LSI.

In FIG. 1, PS1 and PS2 are a first power supply domain circuit and a second power supply domain circuit for corresponding power supply domains, respectively. VDD1 and VSS1 are a first power supply terminal and a first ground terminal, respectively, for the first power supply domain circuit. VDD2 and VSS2 are a second power supply terminal and a second ground terminal, respectively, for the second power supply domain circuit. 101 and 102 are ground lines. Ground line 101 is connected to first ground terminal VSS1. Ground line 102 is connected to second ground terminal VSS2. Ground lines 101 and 102 are connected by bidirectional current path 13, which is a separated-line connecting circuit. Bidirectional current path 13 uses, in this example, a back-to-back diode, which consists of two parallel-connected diodes of a forward direction and a reverse direction. However, not only diodes but mere wiring or a diode-connected MOS transistor, etc., may be used.

The power supply potential and the ground potential which are applied to respective power supply terminal VDD1 and ground terminal VSS1 are supplied to internal circuit 21 through respective power source line 31 and ground line 32. The power supply potential and the ground potential which are applied to respective power supply terminal VDD2 and ground terminal VSS2 are supplied to internal circuit 22 through respective power source line 33 and ground line 34.

ESD protection circuits ESD1 and ESD2 are provided for power supply domain circuits PS1 and PS2, respectively. ESD protection circuits ESD1 and ESD2 are connected between each set of the power supply terminal and the ground terminal of each power supply domain circuit PS1 and PS2, respectively. Output circuit 11 and power supply boundary circuit, such as input circuit 12, are provided in each power supply domain circuit PS1 and PS2. Output circuit 11 is for outputting a signal from internal circuit 21 of a power supply domain to which output circuit 11 belongs. Input circuit 12 is for circuit 22 to receive a signal from output circuit 11 of a different power supply domain. A signal is input into input circuit 12 through internal signal propagation line (boundary signal propagation line). This example shows internal signal propagation line 14 which propagates a signal from output circuit 11 of first power supply domain circuit PS1 to input circuit 12 of second power supply domain circuit PS2 as an example of internal signal propagation line. Voltage detector 20 and voltage limiting circuit 15 are added.

Voltage detector 20 detects a surge voltage input into first node N1 through first power supply terminal VDD1 and a surge voltage input into second node N2 through second power supply terminal VDD2, and outputs a control signal in accordance with the detection from third node N3. First node N1 is connected to first power supply terminal VDD1. Second node N2 is connected to second power supply terminal VDD2. Third node N3 is a control signal node.

Voltage detector 20 is configured as follows, for example. First, first PMOS transistor QP1 and first capacitor C1 are connected in series between first node N1 and third node N3. The back gate of first PMOS transistor QP1 is connected to its own source. Second PMOS transistor QP2 and second capacitor element C2 are connected in series between second node N2 and third node N3. The back gate of second PMOS transistor QP2 is connected to its own source. First NMOS transistor QN1 and second NMOS transistor QN2 are connected in series between third node N3 and fourth node N4 (ground line 102, in this example). Ground line 101 may be used as fourth node N4.

The gate of first PMOS transistor QP1 and the gate of first NMOS transistor QN1 are connected to second node N2. The gate of second PMOS transistor QP2 and the gate of second NMOS transistor QN2 are connected to first node N1.

In this example, voltage limiting circuit 15 is provided in the input side of input circuit 12 of second power supply domain circuit PS2, and limits the voltage level of the signal propagated from internal signal propagation line 14. Voltage limiting circuit 15 consists of NMOS transistor QN0 whose source, drain and gate are connected to ground line 102, internal signal propagation line 14, and third node N3, respectively.

It should be noted that recent manufacturing processes of CMOS LSIs usually provide high-withstand-voltage devices for input/output circuits and low-withstand-voltage devices for an internal circuit to operate at high speed and be densely integrated. High-withstand-voltage devices like those in the input/output circuit of a CMOS LSI may be used for devices in voltage detector 20.

The CMOS LSI of FIG. 1 includes an ESD protection circuit network that conducts a surge current when an ESD input is input between any two of the power supply terminals and the ground terminals to protect internal circuits 21 and 22 which belong to the first and second power supply domain circuits, respectively. As a part of the ESD protection circuit network, ESD protection circuits ESD1 and ESD2, and bidirectional current path 13 connected to ground lines 101 and 102 as mentioned above are used.

Figure 2:
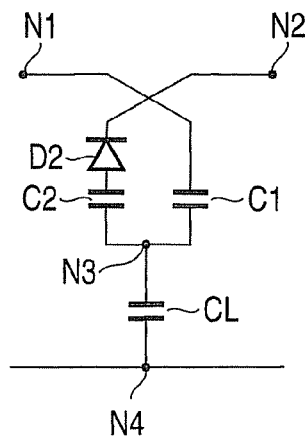
FIG. 2 shows an equivalent circuit of FIG. 1 when an ESD input is applied between VDD1 and VDD2 of the voltage detector.

FIG. 2 shows an equivalent circuit of voltage detector 20 of FIG. 1 with an ESD surge applied between terminals VDD1 and VDD2 to result in on-state PMOS transistor QP1 and off-state PMOS transistor QP2. When the ESD surge is thus applied, the potential of third node N3 is determined in accordance with capacitive coupling of first capacitor C1 between first node N1 and third node N3, second capacitor C2 between second node N2 and third node N3, and the load capacitance CL obtained when measuring the output side from third node N3 (or capacitance which includes the interconnect capacitance of internal signal propagation line 14 and the input capacitance of voltage limiting circuit 15). D2 in the figure is the parasitic diode between the drain and the back gate of off-state PMOS transistor QP2.

In the CMOS LSI of FIG. 1 during normal operation, the normal power supply voltage is applied to terminals VDD1 and VDD2, two NMOS transistors QN1 and QN2 of voltage detector 20 are on, two PMOS transistors QP1 and QP2 are off, and a "low-level" control signal is output from third node N3. Since the control signal output from voltage detector 20 is supplied to voltage limiting circuit 15 through control signal line 16, NMOS transistor QN0 of voltage limiting circuit 15 is off.

On the other hand, when the voltage due to an ESD surge is applied between terminals VDD1 and VDD2, one of PMOS transistors QP1 and QP2 is turned on, and one of NMOS transistors QN1 and QN2 is turned off. And third node N3 outputs a "high-level" control signal, which is determined in accordance with the circuit parameter in voltage detector 20 (which is mainly the capacitance of one of capacitors C1 and C2) and the load capacitance CL obtained when measuring the output side from third node N3. Thereby, NMOS transistor QN0 of voltage limiting circuit 15 is turned on to limit the voltage level of a signal propagated from internal signal propagation line 14 to input circuit 12 of second power supply domain circuit PS2.

When, for example, a positive ESD surge voltage is applied to first power supply terminal VDD1, the surge current flows through first power supply terminal VDD1, ESD protection circuit ESD1, first ground terminal VSS1, bidirectional current circuit 13, second ground terminal VSS2, ESD protection circuit ESD2, second power supply terminal VDD2 (=0V) in the mentioned order. In this condition, assume that first power supply terminal VDD1 is 10V, first ground terminal VSS1 is 4V, and second ground terminal VSS2 is 2V. In other words, the voltage between terminals VDD1 and VSS1 of first power supply domain circuit PS1 is 6V, and voltage between terminals VDD2 and VSS2 of second power supply domain circuit PS2 is -2V.

With this condition, voltage limiting circuit 15 of second power supply domain circuit PS2 is turned on to connect the input node of input circuit 12 to second ground terminal VSS2. Therefore, the voltage applied to the input node of input circuit 12 is eased to be lower than it would be in the absence of a voltage limiting circuit 15.

According to the LSI of the above-mentioned first embodiment, voltage detector 20 and voltage limiting circuit 15 are provided to make it possible to readily realize the function to protect a power supply boundary circuit from surge inputs. Therefore, the ESD protection circuit network does not need to be configured to be able to protect the power supply boundary circuit, and the simplification of the ESD protection circuit network is possible. In other words, it is unnecessary to increase the size of ESD protection devices to assure a large acceptable level of the ground line resistance as the measure taken in conventional examples, and therefore the limitation of the acceptable level of the ground line resistance is eased. Moreover, the limit posed on the potential difference between different power supplies is eased, and it is possible to reduce the size of the ESD protection devices connected to power supply domains. Therefore, chip size can be reduced.

Furthermore, voltage detector 20 can detect both the cases of terminal VDD1 with higher voltage and terminal VDD2 with higher voltage (in other words, for ESD surge in both directions). That is, single voltage detector 20 and its single output signal line effectively serve to two power supply domain circuits. Therefore, the number of the control signal line can be one, and which makes routing easier than the conventional art.

Moreover, since voltage of the "high-level" control signal is determined in accordance with the circuit parameter in voltage detector 20 and the load capacitance obtained when measuring the output side from third node N3, designing is highly flexible and malfunction due to change of the power supply potential and ground potential during normal operation is easily avoided.

Second Embodiment

Figure 3:
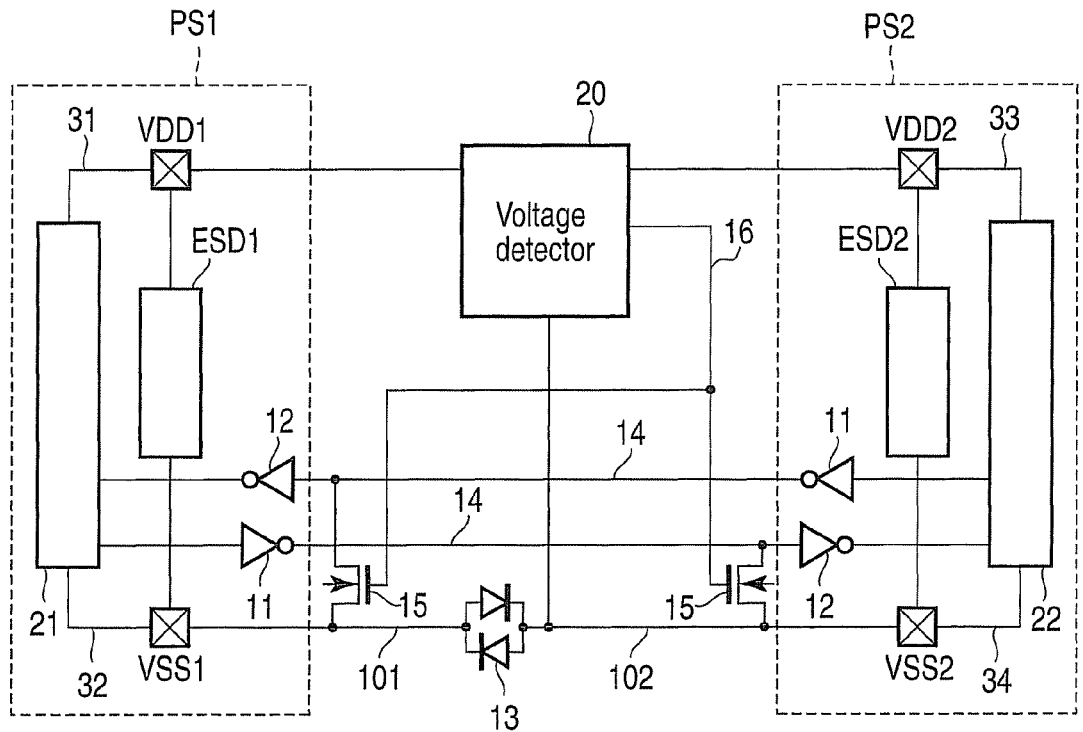
FIG. 3 is a circuit diagram schematically showing a part of a CMOS LSI according to a second embodiment of the present invention.

FIG. 3 schematically shows a circuit of a part of a CMOS LSI according to the second embodiment of the present invention. In the second embodiment, voltage detector 20 which detects applied ESD stress serves for two power supply domain circuits, and voltage limiting circuits 15 provided at the input side of each power supply domain circuit share the control signal output of voltage detector 20.

According to the LSI of the second embodiment, single control signal line 16 can be shared by two power supply domain circuits PS1 and PS2, and therefore the simplification of routing of control signal line 16 is attained.

Third Embodiment

FIG. 4 schematically shows a circuit of a part of a CMOS LSI according to the third embodiment of the present invention.

The third embodiment is different from the second embodiment in that voltage limiting circuits 15 are provided at both the input and output sides of each power supply domain circuit PS1 and PS2, and the voltage limiting circuit of each power supply domain circuit shares the control signal of single voltage detector 20. In the third embodiment, NOR gate 11a with two inputs is used as an output circuit of a power supply domain circuit. NOR gate 11a may have the configuration shown, for example in FIG. 5. More specifically, it consists of two PMOS transistors and two NMOS transistors. Supplying the control signal of voltage detector 20 on control signal line 16 to NOR gate 11a through control signal line 16 provides the configuration which includes voltage limiting circuit 15 inside the output circuit.

According to the LSI of the third embodiment, voltage limiting circuits 15 are also provided in the output side of power supply domain circuits to provide more effective advantage of limiting the voltage level on the internal signal propagation line upon application of an ESD input. Furthermore, each power supply domain circuit can share single control signal line 16 like the second embodiment, and therefore the simplification of routing of control signal line 16 is attained.

Note that the present invention is not limited to the described embodiments, and various modifications are possible within the limits of the spirit of technical concepts. For example, it is possible to reverse the relationship between the power supply potential and the ground potential and to switch conduction type of used devices (PMOS and NMOS).

Additional advantages and modifications will readily occur to those skilled in the art. Therefore, the invention in its broader aspects is not limited to a specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first power supply domain circuit having a first power supply terminal and a first ground terminal;
   a second power supply domain circuit having a second power supply terminal and a second ground terminal;
   an internal signal propagation line propagating a signal from a circuit which belongs to the first power supply domain circuit to a circuit which belongs to the second power supply domain circuit;
   a voltage detector detecting a surge voltage input to the first power supply terminal and a surge voltage input to the second power supply terminal and outputting a control signal from a control signal node in accordance with the detection, the voltage detector determining a potential of the control signal node in accordance with a capacitive coupling by a first capacitor between the first power supply terminal and the control signal node, a second capacitor between the second power supply terminal and the control signal node, and a load capacitance at an output side of the control signal node; and
   a voltage limiting circuit connected to the internal signal propagation line, controlled by the control signal, and limiting a voltage of a signal on the internal signal propagation line.

2. The circuit according to claim 1, wherein the voltage detector circuit includes:
   a first MOS transistor of a first conductive type having a gate connected to the second power supply terminal and having a source and a back gate which are connected to the first power supply terminal, the first capacitor being connected between a drain of the first MOS transistor and the control signal node;
   a second MOS transistor of the first conductive type having a gate connected to the first power supply terminal and having a source and a back gate which are connected to the second power supply terminal, the second capacitor being connected between drain of the second MOS transistor and the control signal node; and
   a third MOS transistor and a fourth MOS transistor which are serially connected between the control signal node and a first node to which a voltage of the first or second ground terminal is supplied, the third MOS transistor having a gate connected to the second power supply terminal, the fourth MOS transistor having a gate connected to the first power supply terminal.

3. The circuit according to claim 2, wherein the voltage limiting circuit comprises a fifth MOS transistor of a second conductive type, and the fifth MOS transistor has a drain connected to the internal signal propagation line and a gate connected to the control signal node.

4. The circuit according to claim 1, further comprising an ESD protection circuit network passing a surge current which is applied between two of the first and second power supply terminals and the first and second ground terminals through the ESD protection circuit network to protect a circuit belonging to the first power supply domain circuit and a circuit belonging to the second power supply domain circuit.

5. The circuit according to claim 4, wherein the ESD protection circuit network includes:
   a first ESD protection circuit connected between the first power supply terminal and the first ground terminal;
   a second ESD protection circuit connected between the second power supply terminal and the second ground terminal; and
   a bidirectional current path connected between the first ground terminal and the second ground terminal.

6. The circuit according to claim 1, wherein the first power supply domain circuit includes a first power line connected to the first power supply terminal and a first ground line connected to the first ground terminal, the second power supply domain circuit includes a second power line connected to the second power supply terminal and a second ground line connected to the second ground terminal, and at least the first power line and the second power line are separated or the first ground line and the second ground line are separated.

7. The circuit according to claim 1, further 5 comprising:
   a second internal signal propagation line propagating a signal from a circuit belonging to the second power supply domain circuit to a circuit belonging to the first power supply domain circuit; and
   a second voltage limiting circuit connected to the second internal signal propagation line, controlled by the control signal, and limiting a voltage of a signal on the second internal signal propagation line.

8. The circuit according to claim 1, wherein the circuit belonging to the first power supply domain circuit comprises a NOR circuit which has a first input receiving the control signal, has a second input receiving a signal output from an internal circuit in the first power supply domain circuit, and has an output connected to the internal signal propagation line.

9. A semiconductor integrated circuit comprising:
a first power supply domain circuit having a first power supply terminal and a first ground terminal;
a second power supply domain circuit having a second power supply terminal and a second ground terminal;
an internal signal propagation line propagating a signal from a circuit belonging to the first power supply domain circuit to a circuit belonging to the second power supply domain circuit;
a voltage detector detecting a surge voltage input to the first power supply terminal and a surge voltage input to the second power supply terminal, and outputting a control signal from a control signal node in accordance with the detection, wherein the voltage detector comprises:
a first MOS transistor of a first conductive type having a gate connected to the second power supply terminal and having a source and a back gate which are connected to the first power supply terminal;
a second MOS transistor of the first conductive type having a gate connected to the first power supply terminal and having a source and a back gate which are connected to the second power supply terminal;
a third MOS transistor and a fourth MOS transistor which are serially connected between the control signal node and a first node to which a voltage of the first or second ground terminal is supplied, the third MOS transistor having a gate connected to the second power supply terminal, the fourth MOS transistor having a gate connected to the first power supply terminal;
a first capacitor connected between a drain of the first MOS transistor and the control signal node; and
a second capacitor connected between a drain of the second MOS transistor and the control signal node; and
a voltage limiting circuit connected to the internal signal propagation line, controlled by the control signal, and limiting a voltage of a signal on the internal signal propagation line.

10. The circuit according to claim 9, wherein the first power supply domain circuit includes a first power line connected to the first power supply terminal and a first ground line connected to the first ground terminal, the second power supply domain circuit includes a second power line connected to the second power supply terminal and a second ground line connected to the second ground terminal, and at least the first power line and the second power line are separated or the first ground line and the second ground line are separated.

11. The circuit according to claim 9, wherein a potential of the control node is determined in accordance with a capacitive coupling by the first and second capacitors and a load capacitance at an output side of the control signal node.

12. The circuit according to claim 9, wherein the voltage limiting circuit comprises a fifth MOS transistor of a second conductive type, and the fifth MOS transistor has a drain connected to the internal signal propagation line and a gate connected to the control signal node.

13. The circuit according to claim 9 further comprising an ESD protection circuit network passing a surge current which is applied between two of the first and second power supply terminals and the first and second ground terminals through the ESD protection circuit network to protect a circuit belonging to the first power supply domain circuit and a circuit belonging to the second power supply domain circuit.

14. The circuit according to claim 13, wherein the ESD protection circuit network includes:
a first ESD protection circuit connected between the first power supply terminal and the first ground terminal;
a second ESD protection circuit connected between the second power supply terminal and the second ground terminal; and
a bidirectional current path connected between the first ground terminal and the second ground terminal.

15. The circuit according to claim 9 further comprising:
a second internal signal propagation line propagating a signal from a circuit belonging to the second power supply domain circuit to a circuit belonging to the first power supply domain circuit; and
a second voltage limiting circuit connected to the second internal signal propagation line, controlled by the control signal, and limiting a voltage of a signal on the second internal signal propagation line.

16. The circuit according to claim 9, wherein the circuit belonging to the first power supply domain circuit comprises a NOR circuit which has a first input receiving the control signal, has a second input receiving a signal output from an internal circuit in the first power supply domain circuit, and has an output connected to the internal signal propagation line.

17. A semiconductor integrated circuit comprising:
a first power supply domain circuit having a first power supply terminal, a first power line connected to the first power supply terminal, a first ground terminal and a first ground line connected to the first ground terminal;
a second power supply domain circuit having a second power supply terminal, a second power line connected to the second power supply terminal, a second ground terminal, and a second ground line connected to the second ground terminal, wherein at least the first power line and the second power line are separated or the first ground line and the second ground line are separated;
an internal signal propagation line propagating a signal from a circuit which belongs to the first power supply domain circuit to a circuit which belongs to the second power supply domain circuit;
a voltage detector detecting a surge voltage input to the first power supply terminal and a surge voltage input to the second power supply terminal and outputting a control signal from a control signal node in accordance with the detection, the voltage detector determining a potential of the control signal node in accordance with a capacitive coupling by a first capacitor between the first power supply terminal and the control signal node, a second capacitor between the second power supply terminal and the control signal node, and a load capacitance at an output side of the control signal node; and
a voltage limiting circuit connected to the internal signal propagation line, controlled by the control signal, and limiting a voltage of a signal on the internal signal propagation line.

18. The circuit according to claim 17, wherein the voltage detector circuit includes:
a first MOS transistor of a first conductive type having a gate connected to the second power supply terminal and having a source and a back gate which are connected to the first power supply terminal, the first capacitor being connected between a drain of the first MOS transistor and the control signal node;

a second MOS transistor of the first conductive type having a gate connected to the first power supply terminal and having a source and a back gate which are connected to the second power supply terminal, the second capacitor being connected between drain of the second MOS transistor and the control signal node; and a third MOS transistor and a fourth MOS transistor which are serially connected between the control signal node and a first node to which a voltage of the first or second ground terminal is supplied, the third MOS transistor having a gate connected to the second power supply terminal, the fourth MOS transistor having a gate connected to the first power supply terminal.

19. The circuit according to claim 17 further comprising an ESD protection circuit network passing a surge current which is applied between two of the first and second power supply terminals and the first and second ground terminals through the ESD protection circuit network to protect a circuit belonging to the first power supply domain circuit and a circuit belonging to the second power supply domain circuit, wherein the ESD protection circuit network includes:

a first ESD protection circuit connected between the first power supply terminal and the first ground terminal;

a second ESD protection circuit connected between the second power supply terminal and the second ground terminal; and a bidirectional current path connected between the first ground terminal and the second ground terminal.

20. A semiconductor integrated circuit comprising:

a first power supply domain circuit having a first power supply terminal and a first ground terminal;

a second power supply domain circuit having a second power supply terminal and a second ground terminal;

an internal signal propagation line propagating a signal from a circuit belonging to the first power supply domain circuit to a circuit belonging to the second power supply domain circuit;

a voltage detector detecting a surge voltage input to the first power supply terminal and a surge voltage input to the second power supply terminal, and outputting a control signal from a control signal node in accordance with the detection, and a voltage limiting circuit connected to the internal signal propagation line, controlled by the control signal, and limiting a voltage of a signal on the internal signal propagation line, wherein the voltage limiting circuit comprises a fifth MOS transistor of a second conductive type, and the fifth MOS transistor has a drain connected to the internal signal propagation line and a gate connected to the control signal node.

* * * * *